United States Patent [19]
Jang et al.

[11] Patent Number: 5,892,722
[45] Date of Patent: Apr. 6, 1999

[54] COLUMN SELECTION CIRCUIT

[75] Inventors: Seong Jin Jang; Young Hyun Jun; Sung Wook Kim; Tae Hoon Kim, all of Seoul, Rep. of Korea

[73] Assignee: LG Semicon., Ltd., Chungcheongbuk-do, Rep. of Korea

[21] Appl. No.: 126,737

[22] Filed: Jul. 31, 1998

[30] Foreign Application Priority Data

Mar. 13, 1998 [KR] Rep. of Korea .................... 8517/1998

[51] Int. Cl.[6] .................................................. G11C 7/00
[52] U.S. Cl. ........................ 365/203; 365/205; 365/207; 365/208
[58] Field of Search .................................. 365/203, 205, 365/207, 208, 189.01

[56] References Cited

U.S. PATENT DOCUMENTS

| | | | |
|---|---|---|---|
| 4,984,206 | 1/1991 | Komatsu et al. | 365/208 |
| 5,323,349 | 6/1994 | Hamade et al. | |
| 5,539,279 | 7/1996 | Takeuchi et al. | 365/203 |

OTHER PUBLICATIONS

Taguchi, et al, "A 40–ns 64–Mb DRAM with 64–b Parallel Data Bus Architecture", IEEE Journal of Solid–State Circuits, vol., 26, No. 11, Nov. 1991, pp. 1493–1497.

*Primary Examiner*—Vu A. Le

[57] ABSTRACT

A column selection circuit is disclosed, in which a layout area is minimized by reducing the number of data bus lines and sensing speed characteristic is improved by reducing sensing time of a bit line. In a memory for transmitting data stored in a memory cell to a main sensing amplifier through a bit line and a bit bar line and storing the data output from the main sensing amplifier in the memory cell through the bit line and the bit bar line, the column selection circuit includes an equalizer for equalizing the bit line and the bit bar line, a bit line sensing amplifier for compensating signal voltage levels of the bit line and the bit bar line as a word line is selected, first and second enable signal output portions for outputting enable signals to operate the bit line sensing amplifier, a data bus line and a data bus bar line for transmitting the data transmitted to the bit line and the bit bar line from the memory cell to the main sensing amplifier, and transmitting the data output from the main sensing amplifier to the bit line and the bit bar line, a data transmission portion for selectively transmitting the data of the data bus line and data bus bar line and the data of the bit line and bit bar line between the respective lines in response to a column selection signal, a control signal for reading and a write enable signal, and a precharge level adjusting portion for adjusting precharge level of the data bus line and the data bus bar line.

10 Claims, 6 Drawing Sheets

COLUMN SELECTION CIRCUIT

BACKGROUND OF THE INVENTION

1. Field of the Invention

The present invention relates to a semiconductor memory, and more particularly, to a column selection circuit of a DRAM.

2. Discussion of the Related Art

A conventional column selection circuit will be described with reference to the accompanying drawings.

Figure 1:
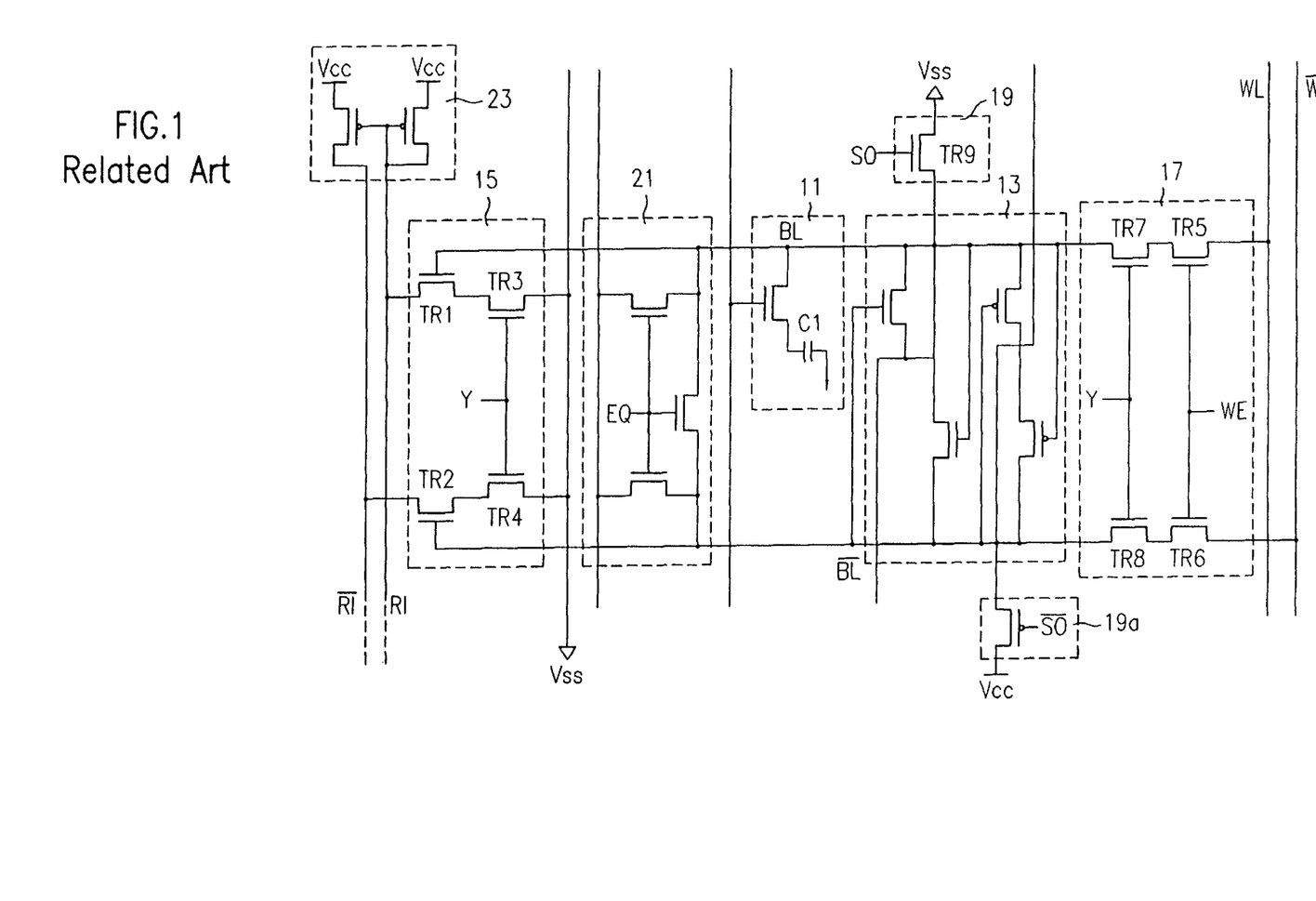
FIG. 1 is a schematic view illustrating a conventional column selection circuit of a DRAM.

FIG. 1 is a schematic view illustrating a conventional column selection circuit.

As shown in FIG. 1, the conventional column selection circuit includes a memory cell 11, a bit line sensing amplifier 13, a read bus line RI, a read bus bar line $\overline{RI}$, a write bus line WI, a write bus bar line $\overline{WI}$, a first data transmission portion 15, a second data transmission portion 17, a first enable signal output portion 19, a second enable signal output portion 19a, an equalizer 21, and a precharge level adjusting portion 23. The memory cell 11 stores data. The bit line sensing amplifier 13 senses the data of the memory cell 11. The read bus line RI and the read bus bar line $\overline{RI}$ transmit the data output from the bit line sensing amplifier 13 to a main sensing amplifier (not shown). The write bus line WI and the write bus bar line $\overline{WI}$ transmit the data output from the main sensing amplifier to the bit line sensing amplifier 13. The first data transmission portion 15 transmits the data output from the bit line sensing amplifier 13 to the read bus line RI and read bus bar line $\overline{RI}$. The second data transmission portion 17 transmits the data of the write bus line WI and the write bus bar line $\overline{WI}$ to the bit line sensing amplifier 13. The first and second enable signal output portions 19 and 19a output enable signals to the bit line amplifier 13. The equalizer 21 equalizes a bit line BL and a bit bar line $\overline{BL}$. The precharge level adjusting portion 23 adjusts precharge level of the read bus line RI and read bus bar line $\overline{RI}$.

The first data transmission portion 15 includes first, second, third and fourth transistors TR1, TR2, TR3, and TR4. A gate of the first transistor TR1 is connected to the bit line BL and its drain is connected to the read bus line RI. A gate of the second transistor TR2 is connected to the bit bar line $\overline{BL}$ and its drain is connected to the read bus bar line $\overline{RI}$. A source of the third transistor TR3 is connected to a ground voltage terminal Vss and its drain is connected to a source of the first transistor TR1. A column selection signal Y is applied to a gate of the third transistor TR3. A source of the fourth transistor TR4 is connected to the ground voltage terminal Vss and its drain is connected to the source of the second transistor TR2. The column selection signal Y is applied to a gate of the fourth transistor TR4.

The second data transmission portion 17 includes fifth, sixth, seventh, and eighth transistors TR5, TR6, TR7, and TR8. A drain of the fifth transistor TR5 is connected to the write bus line WI. A write enable signal WE is applied to a gate of the fifth transistor TR5. A drain of the sixth transistor TR6 is connected to the write bus bar line $\overline{WI}$ and its gate is in common connected with the gate of the fifth transistor TR5. A source of the seventh transistor TR7 is connected to the bit line BL and its drain is connected to the source of the fifth transistor TR5. The column selection signal Y is applied to a gate of the seventh transistor TR7. A source of the eighth transistor TR8 is connected to the bit bar line $\overline{BL}$ and its drain is connected to the source of the sixth transistor TR6. A gate of the eighth transistor TR8 is in common connected with the gate of the seventh transistor TR7.

The first enable signal output portion 19 outputs the enable signal to the bit line sensing amplifier 13 to maintain the bit line BL at high level completely. The first enable signal output portion 19 includes a ninth transistor TR9 which is operated by a gate input signal S0. A source of the ninth transistor TR9 is connected to the ground voltage terminal Vss.

The second enable signal output portion 19a outputs the enable signal to the bit line sensing amplifier 13 to maintain the bit line BL at low level completely. The second enable signal output portion 19a includes a tenth transistor TR10 which is operated by a gate input signal S0. A drain of the tenth transistor TR10 is connected to a power source voltage terminal Vcc.

The operation of the aforementioned conventional column selection circuit will be described below.

Figure 2:
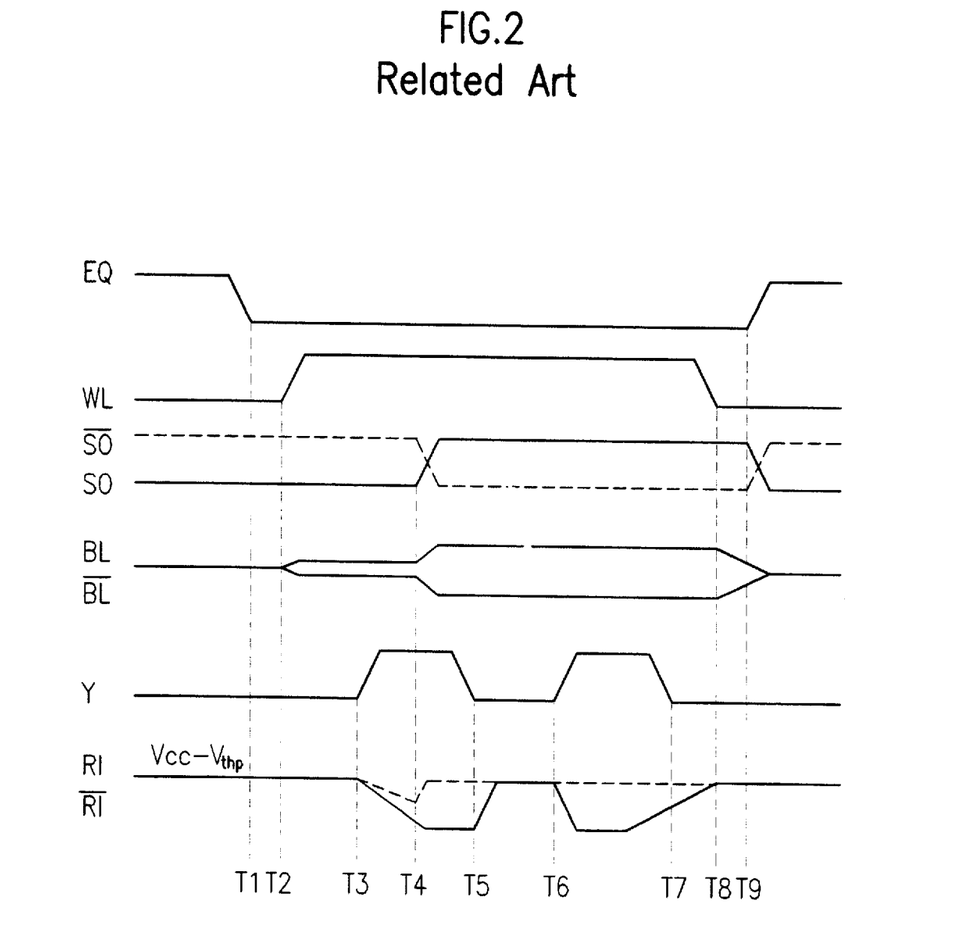
FIG. 2 are waveforms illustrating the operation of a conventional column selection circuit of a DRAM.

FIG. 2 are waveforms illustrating the operation of the conventional column selection circuit.

First, the step of transmitting data of a cell C1 to the read bus line RI and the read bus bar line $\overline{RI}$ will be described.

As shown in FIG. 2, if an equalizing signal EQ is changed from high level to low level (T1), the bit line BL and the bit bar line $\overline{BL}$ depart from equalizing state and a word line WL is changed from low level to high level (T2).

If the word line WL becomes high level, the data stored in the cell C1 are transmitted to the bit line BL as shown in FIG. 1. As a result, some voltage difference occurs between the bit line BL and the bit bar line $\overline{BL}$.

Thereafter, a high signal is applied to the gate of the ninth transistor TR9 of the first enable signal output portion 19 (T4) (S0=high) and a low signal is applied to the gate of the tenth transistor TR10 of the second enable signal output portion 19a (T4) (S0=low). Then, as shown in FIG. 2, the bit line BL is compensated to high level completely and the bit bar line $\overline{BL}$ is compensated to low level completely. As a result, the data stored in the memory cell 11 is loaded to the bit line BL.

Voltage difference between the read bus line RI and the read bus bar line $\overline{RI}$ depending on the column selection signal is as follows.

As shown in FIG. 2, if the column selection signal Y is changed from low level to high level (T3), the third and fourth transistors TR3 and TR4 are turned on. The seventh and eighth transistors TR7 and TR8 are turned on, too.

At this time, the first transistor TR1 whose gate is connected to the bit line BL is turned on and the second transistor TR2 whose gate is connected to the bit bar line $\overline{BL}$ is turned off. This is the reason why the bit line BL is maintained at high level and the bit bar line $\overline{BL}$ is maintained at low level as the data of the cell C1 are transmitted to the bit line BL by the word line WL having high level.

Therefore, the data of the bit line BL and bit bar line $\overline{BL}$ are transmitted to the read bus line RI and read bus bar line $\overline{RI}$.

However, if the column selection signal becomes high at the state that the bit line BL and the bit bar line $\overline{BL}$ are not completely maintained at high level and low level, respectively, the first, second, third and fourth transistors TR1, TR2, TR3 and TR4 are all turned on so that the ground voltage is applied to the read bus line RI and the read bus bar line $\overline{RI}$.

As a result, the voltage level of the read bus line RI and read bus bar line $\overline{RI}$ becomes low.

The step of transmitting the data of the memory cell to the write bus line WI and write bus bar line $\overline{WI}$ will now be described.

As shown in FIG. 1, if the write enable signal WE and the column selection signal Y become high, the fifth, sixth, seventh and eighth transistors TR5, TR6, TR7 and TR8 are all turned on. Thus, the data of the write bus line WI and write bus bar line $\overline{WI}$ are transmitted to the bit line BL and the bit bar line $\overline{BL}$ through the turned on transistors TR5, TR6, TR7 and TR8.

At this time, since the first and second transistors TR1 and TR2 are connected to the bit line BL and the bit bar line $\overline{BL}$, respectively, at least one of the first and second transistors TR1 and TR2 is turned on.

If the bit line BL is high level and the bit bar line $\overline{BL}$ is low level, the first transistor TR1 and the third transistor TR3 are turned on. In that case, a current path which is unnecessary is formed between the ground voltage terminal Vss and the read bus line RI. In other words, the read bus line RI is unnecessarily selected during writing the data in the memory cell.

The aforementioned conventional column selection circuit has several problems.

Since the read bus line and the write bus line are separated from each other, a layout area increases and thus the size of a chip increases. In addition, an unnecessary current path is formed by the column selection circuit for reading during data writing.

SUMMARY OF THE INVENTION

Accordingly, the present invention is directed to a column selection circuit that substantially obviates one or more of the problems due to limitations and disadvantages of the related art.

An object of the present invention is to provide a column selection circuit in which one bus line is in common used for a read bus line and a write bus line so that a layout area is minimized and an unnecessary current path is not formed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a memory for transmitting data stored in a memory cell to a main sensing amplifier through a bit line and a bit bar line and storing the data output from the main sensing amplifier in the memory cell through the bit line and the bit bar line, a column selection circuit according to the present invention includes an equalizer for equalizing the bit line and the bit bar line, a bit line sensing amplifier for compensating signal voltage levels of the bit line and the bit bar line as a word line is selected, first and second enable signal output portions for outputting enable signals to operate the bit line sensing amplifier, a data bus line and a data bus bar line for transmitting the data transmitted to the bit line and the bit bar line from the memory cell to the main sensing amplifier, and transmitting the data output from the main sensing amplifier to the bit line and the bit bar line, a data transmission portion for selectively transmitting the data of the data bus line and data bus bar line and the data of the bit line and bit bar line between the respective lines in response to a column selection signal, a control signal for reading and a write enable signal, and a precharge level adjusting portion for adjusting precharge level of the data bus line and the data bus bar line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
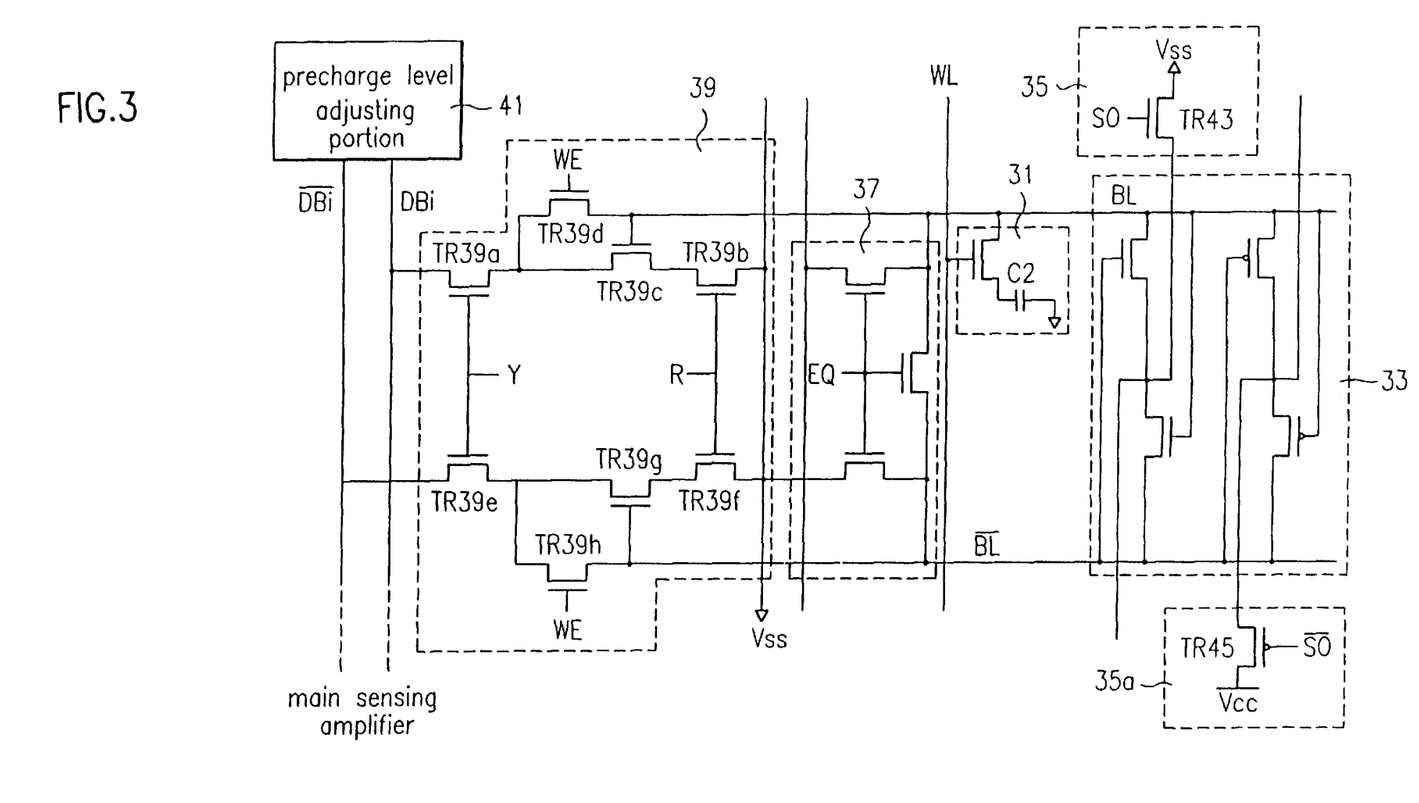
FIG. 3 is a schematic view illustrating a column selection circuit of a DRAM according to the present invention.

As shown in FIG. 3, a column selection circuit of the present invention includes a memory cell 31, a bit line sensing amplifier 33, a first enable signal output portion 35, a second enable signal output portion 35a, an equalizer 37, a data bus line DBi, a data bus bar line $\overline{DBi}$, a data transmission portion 39, and a precharge level adjusting portion 41. The memory cell 31 stores data. The bit line sensing amplifier 33 senses signal voltages of a bit line BL and a bit bar line $\overline{BL}$ and compensates the signal voltage levels. The first and second enable signal output portions 35 and 35a output enable signals to the bit line sensing amplifier 33. The equalizer 37 equalizes the bit line BL and the bit bar line $\overline{BL}$. The data bus line DBi and the data bus bar line $\overline{DBi}$ transmit the data of the bit line BL and the bit bar line $\overline{BL}$ to a main sensing amplifier (not shown), and transmit the data output from the main sensing amplifier to the bit line BL and the bit bar line $\overline{BL}$. The data transmission portion 39 transmits the data of the bit line BL and the bit bar line $\overline{BL}$ to the data bus line DBi and the data bus bar line $\overline{DBi}$ or transmits the data of the data bus line DBi and the data bus bar line $\overline{DBi}$ to the bit line BL and the bit bar line $\overline{BL}$, in response to a column selection signal Y, a control signal R for reading, and a write enable signal WE. The precharge level adjusting portion 41 adjusts precharge level of the data bus line DBi and data bus bar line $\overline{DBi}$.

The data transmission portion 39 includes transistors TR39a, TR39b, TR39c, and TR39d. The transistors TR39a, TR39b, TR39c, and TR39d are NMOS transistors. The column selection signal Y is applied to a gate of the transistor TR39a and a drain of the transistor TR39a is connected to the data bus line DBi. The control signal R for reading is applied to a gate of the transistor TR39b and a source of the transistor TR39b is connected to a ground voltage terminal Vss. A gate of the transistor TR39c is connected to the bit line BL, its source is connected to a drain of the transistor TR39b, and its drain is connected to the source of the transistor TR39a. A source of the transistor TR39d is connected to the bit line BL and its drain is connected to the source of the transistor TR39a. The transistor TR39d is operated by the write enable signal WE.

Further, the data transmission portion 39 includes NMOS transistors TR39e, TR39f, TR39g, and TR39h which are symmetrical to the transistors TR39a, TR39b, TR39c, and TR39d.

The configuration of the transistors TR39e, TR39f, TR39g, and TR39h are as follows.

As shown in FIG. 3, a gate of the transistor TR39e is connected to the column selection signal Y and its drain is connected to the data bus bar line $\overline{DBi}$. The control signal R for reading is applied to a gate of the transistor TR39f and a source of the transistor TR39f is connected to the ground voltage terminal Vss. A gate of the transistor TR39g is connected to the bit bar line $\overline{BL}$ and its source is connected to a drain of the transistor TR39f. The write enable signal WE is applied to a gate of the transistor TR39h. A drain of the transistor TR39h is connected to the source of the transistor TR39e and its source is connected to the bit bar line $\overline{BL}$.

The operation of the column selection circuit according to the present invention will be described.

Figure 4:
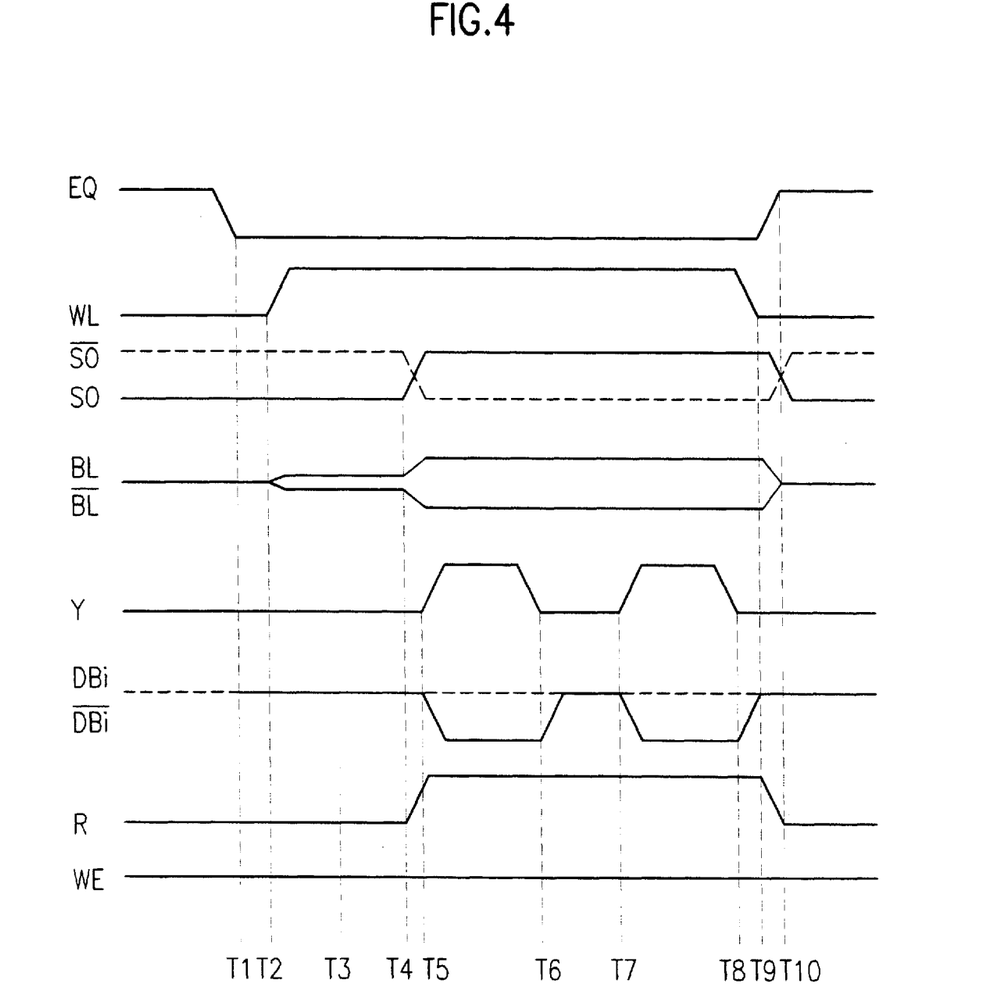
FIG. 4 are waveforms illustrating the operation of a column selection circuit of a DRAM according to the present invention.

FIG. 4 are waveforms of the operation of the column selection circuit according to the present invention.

The step of transmitting data of a memory cell to the data bus line DBi and the data bus bar line $\overline{DBi}$ will be described with reference to FIGS. 3 and 4.

As shown in FIG. 4, if an equalizing signal for equalizing the bit line BL and the bit bar line $\overline{BL}$ is changed from high level to low level (T1), the bit line BL and the bit bar line $\overline{BL}$ depart from equalizing state and a word line WL is changed from low level to high level (T2).

If the word line WL becomes high level, the data stored in a cell C2 of the memory cell 31 are transmitted to the bit line BL. As a result, some voltage difference occurs between the bit line BL and the bit bar line $\overline{BL}$.

Thereafter, a high signal is applied to a gate of a transistor TR43 of the first enable signal output portion 35 (S0=high) (T4) and a low signal is applied to a gate of a transistor TR45 of the second enable signal output portion 35a (S0=low) (T4). Then, the bit line BL is compensated to high level completely and the bit bar line $\overline{BL}$ is compensated to low level completely.

At this time, if the control signal R for reading and the column selection signal Y become high, the transistors TR39a, TR39b and TR39c of the data transmission portion 39 are turned on.

Thus, the ground voltage Vss is transmitted to the data bus line DBi and thus the voltage level of the data bus line DBi becomes low. On the other hand, the voltage level of the data bus bar line $\overline{DBi}$ is maintained at precharge level.

The data of the bit line BL and the bit bar line $\overline{BL}$ are transmitted to the data bus line DBi and the data bus bar line $\overline{DBi}$ during reading.

Subsequently, the step of transmitting the data of the data bus line DBi and the data bus bar line $\overline{DBi}$ to the bit line BL and the bit bar line $\overline{BL}$ during writing will be described.

As shown in FIG. 4, if the write enable signal WE for writing and the column selection signal Y become high, the transistors TR39a and TR39d of the data transmission portion 39 are turned on. In addition, the transistors TR39e and TR39h are turned on.

Thus, the data of the data bus line DBi are transmitted to the bit line BL through the transistors TR39a and TR39d. The data of the data bus bar line $\overline{DBi}$ are transmitted to the bit bar line $\overline{BL}$ through the transistors TR39e and TR39h.

At this time, since the control signal R for reading is not high, the transistors TR39b and TR39e are turned off, so that a current path does not occur between the data bus line DBi and the data bus bar line $\overline{DBi}$.

Figure 5:
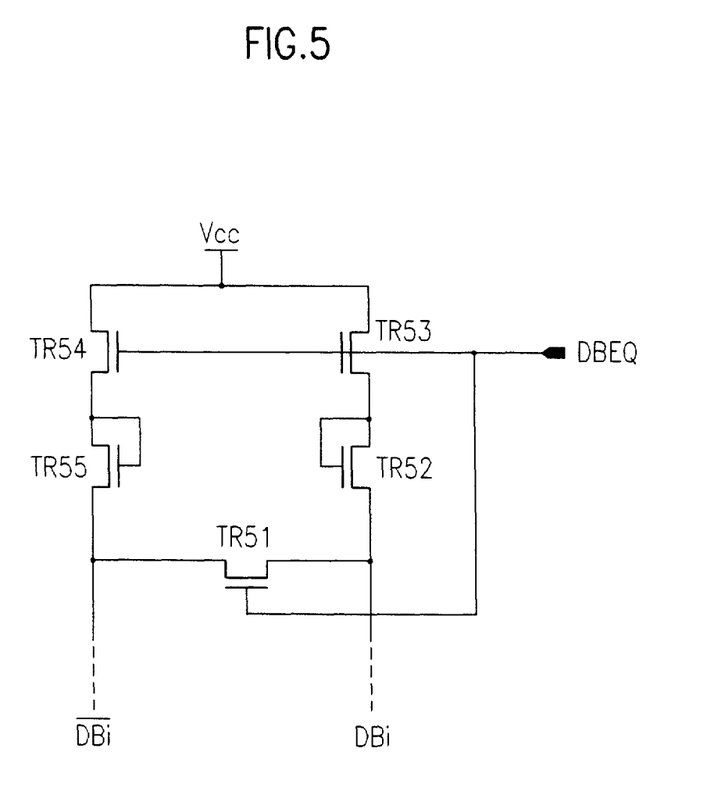
FIG. 5 is a schematic view illustrating a precharge level adjusting portion according to the present invention.

Meanwhile, FIG. 5 is a schematic view illustrating a precharge level adjusting portion according to the column selection circuit of the present invention.

As shown in FIG. 5, the precharge level adjusting portion includes transistors TR51, TR52, TR53, TR54, and TR55. A source of the transistor TR51 is connected to the data bus line DBi and its drain is connected to the data bus bar line $\overline{DBi}$. The transistor TR51 is operated by a data bus line and data bus bar line equalizing (DBEQ) signal input to its gate. A source of the transistor TR52 is connected to the data bus line DBi, and its drain and gate are in common connected. A drain of the transistor TR53 is connected to the power source voltage terminal Vcc and its source is connected to the drain of the transistor TR52. The transistor TR53 is operated by the DBEQ signal input to its gate.

The transistors TR54 and TR55 have configurations symmetrical to the transistors TR52 and TR53. A source of the transistor TR55 is connected to the data bus bar line $\overline{DBi}$, and its drain and gate are in common connected. A drain of the transistor TR54 is connected to the power source voltage terminal Vcc and its source is connected to the drain of the transistor TR55. The transistor TR54 is operated by the DBEQ signal input to its gate.

Therefore, the precharge level of the data bus line DBi and the data bus bar line $\overline{DBi}$ is determined by subtracting threshold voltages of two transistors from the power source voltage Vcc. In other words, the precharge level of the data bus line DBi and the data bus bar line $\overline{DBi}$ is $Vcc-2V_{TH}$.

Sensing speed can be improved by lowering the precharge level as above.

Figure 6:
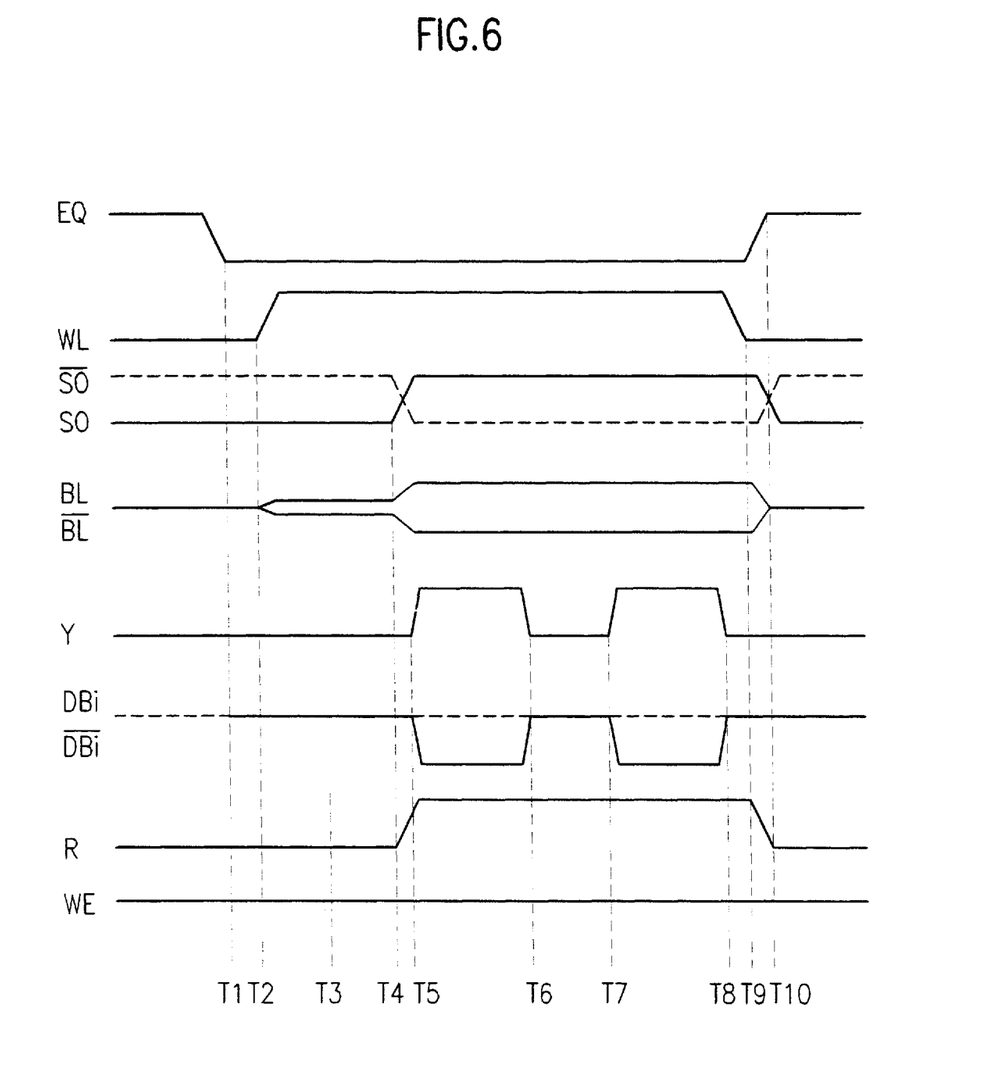
FIG. 6 are waveforms illustrating the operation of a column selection circuit including the precharge level adjusting portion of FIG. 5.

FIG. 6 are waveforms illustrating the column selection circuit including the precharge level adjusting portion of FIG. 5.

As shown in FIG. 6, delay time can be minimized in transmitting the data of the bit line BL to the data bus line DBi as the precharge level of the data bus line DBi and the data bus bar line $\overline{DBi}$ is maintained at $Vcc-2V_{TH}$. As a result, sensing speed can be improved.

As aforementioned, the column selection circuit of the present invention has the following advantages.

First, since the data bus line is used for reading and writing without separately forming a read bus line and a write bus line, a layout area can be minimized, thereby reducing the size of a chip.

Second, since writing operation and reading operation are distinguished from each other, an unnecessary current path such as a read path does not occur during writing operation.

Finally, sensing speed can be improved by lowering the precharge level.

It will be apparent to those skilled in the art that various modifications and variations can be made in the column selection circuit according to the present invention without departing from the spirit or scope of the invention. Thus, it is intended that the present invention covers the modifications and variations of the invention provided they come within the scope of the appended claims and their equivalents.

What is claimed is:

1. In a memory for transmitting data stored in a memory cell to a main sensing amplifier through a bit line and a bit bar line and storing the data output from the main sensing amplifier in the memory cell through the bit line and the bit bar line, a column selection circuit comprising:

an equalizer for equalizing the bit line and the bit bar line;

a bit line sensing amplifier for compensating signal voltage levels of the bit line and the bit bar line as a word line is selected;

first and second enable signal output portions for outputting enable signals to operate the bit line sensing amplifier;

a data bus line and a data bus bar line for transmitting the data transmitted to the bit line and the bit bar line from the memory cell to the main sensing amplifier, and transmitting the data output from the main sensing amplifier to the bit line and the bit bar line;

a data transmission portion for selectively transmitting the data of the data bus line and data bus bar line and the data of the bit line and bit bar line between the respective lines in response to a column selection signal, a control signal for reading and writing enable signals; and a precharge level adjusting portion for adjusting precharge level of the data bus line and the data bus bar line.

2. The column selection circuit as claimed in claim 1, wherein the data transmission portion includes:

transistors TR39a and TR39e whose drains are respectively connected to the data bus line and the data bus bar line, wherein the transistors TR39a and TR39e are operated by the column selection signal input their gates;

transistors TR39d and TR39h whose sources are respectively connected to the bit line and the bit bar line and drains are respectively connected to the sources of the transistors TR39a and TR39e, wherein the transistors TR39d and TR39h are operated by the write enable signal input to their gates;

transistors TR39b and TR39f whose sources are respectively connected to a ground voltage terminal Vss, wherein the transistors TR39b and TR39f are operated by the control signal for reading, which is input to their gates; and transistors TR30c and TR39g whose drains are respectively connected to the sources of the transistors TR39a and TR39e, sources are connected to the drains of the transistors TR39b and TR39f, and gates are respectively connected to the bit line and the bit bar line.

3. The column selection circuit as claimed in claim 1, wherein the precharge level adjusting portion includes:

transistors TR53 and TR54 whose drains are connected to the power source voltage terminal Vcc, wherein the transistors TR53 and TR54 are operated by a data bus line and data bus bar line equalizing (DBEQ) signal input to their gates;

transistors TR55 and TR52 whose drains and gates are in common connected to sources of the transistors TR53 and TR54 and sources are connected to the data bus line and the data bus bar line, respectively; and a transistor TR51 whose drain is connected to the data bus line and source is connected to the data bus bar line, wherein the transistor TR51 is operated by the DBEQ signal.

4. The column selection circuit as claimed in claim 1, wherein the data bus line and the data bus bar line are selectively used in response to reading and writing operation.

5. The column selection circuit as claimed in claim 1, wherein the precharge level of the data bus line and the data bus bar line is determined as $Vcc-2V_{TH}$ by the precharge level adjusting portion.

6. The column selection circuit as claimed in claim 4, wherein the data bus line has a low voltage level and the data bus bar line is maintained at precharge state during reading operation.

7. The column selection circuit as claimed in claim 2, wherein the transistors TR39a, TR39b, TR39c, TR39d, TR39e, TR39f, TR39g and TR39h are NMOS transistors.

8. The column selection circuit as claimed in claim 6, wherein the ground voltage is applied to the data bus line through the transistors TR39a, TR39b and TR39c during reading operation so as to lower voltage level of the data bus line.

9. The column selection circuit as claimed in claim 6, wherein the data of the data bus line are transmitted to the bit line through the transistors TR39a and TR39d during writing operation.

10. The column selection circuit as claimed in claim 7, wherein the transistors TR39b and TR39f are turned off during writing operation.

* * * * *